United States Patent [19]

Ngai et al.

[11] Patent Number: 5,559,450
[45] Date of Patent: Sep. 24, 1996

[54] FIELD PROGRAMMABLE GATE ARRAY WITH MULTI-PORT RAM

[75] Inventors: Kai-Kit Ngai, Allentown; Satwant Singh, Macungie, both of Pa.

[73] Assignee: Lucent Technologies Inc., Murray Hill, N.J.

[21] Appl. No.: 507,957

[22] Filed: Jul. 27, 1995

[51] Int. Cl.[6] .................................................. H03K 19/177
[52] U.S. Cl. ........................... 326/40; 326/39; 365/189.08
[58] Field of Search ............................... 326/37, 39–41, 326/46, 47, 38; 365/189.08

[56] References Cited

U.S. PATENT DOCUMENTS

| | | | |
|---|---|---|---|
| Re. 34,363 | 8/1993 | Freeman | 307/465 |
| 4,870,302 | 9/1989 | Freeman | 307/465 |
| 5,128,559 | 7/1992 | Steele | 365/189.08 |
| 5,255,221 | 10/1993 | Hill | 365/189.08 |
| 5,282,174 | 1/1994 | Little | 365/230.05 |
| 5,343,406 | 8/1994 | Freeman | 326/40 |
| 5,384,497 | 1/1995 | Britton et al. | 326/44 |
| 5,386,156 | 1/1995 | Britton et al. | 326/37 |
| 5,442,306 | 8/1995 | Woo | 326/40 |

FOREIGN PATENT DOCUMENTS

0177261B1  11/1990  European Pat. Off. ..... H03K 19/177

OTHER PUBLICATIONS

Knapp, S. K. "XC4000E Edge-Triggered and Dual-Part RAM Capability". Xilinx, Inc., Jun. 20, 1995, pp. 1–3.

Cartier, L. "Implementing FIFOs in XC4000E RAM". Xilinx, Inc., Oct. 9, 1995. pp. 1–15.

"XC4000E Logic Cell Array Family", Product Preview, by Xilinx, Inc., May 2, 1995, pp. 1–4.

Primary Examiner—Edward P. Westin
Assistant Examiner—Jon Santamauro
Attorney, Agent, or Firm—James H. Fox

[57] ABSTRACT

A field programmable gate array (FPGA) with a programmable function unit (PFU) that includes a look-up table (LUT) for implementing a plurality of functions including first and second RAM cells, and a programmable switching device dedicated to coupling and decoupling the RAM cells. The first and second RAM cells are coupled to respective first and second read/write ports. The RAM cells function individually as single-port RAM cells when decoupled by the switching device. However, the RAM cells share data to function collectively as a dual-port RAM cell when coupled by the switching device. The dual-port RAM cell is accessible by both the first and second read/write ports.

25 Claims, 5 Drawing Sheets

FIELD PROGRAMMABLE GATE ARRAY WITH MULTI-PORT RAM

FIELD OF THE INVENTION

The invention relates generally to programmable logic devices, and particularly to field programmable gate arrays which utilize programmable function units.

BACKGROUND OF THE INVENTION

Application-specific integrated circuits (ASICs) are designed to perform a specific function., as opposed to a microprocessor which can be programmed to perform a variety of functions. The major advantages of ASICs are typically lower unit cost and higher performance. ASICs are normally fabricated in some form of complementary metal-oxide semiconductor (CMOS) technology using custom, standard cell, physical placement of logic (PPL), gate array, or field programmable gate array (FGPA) design.

Gate arrays and FPGAs are semi-custom devices which contain a fixed set of gate structures which may be interconnected in a number of ways to achieve a desired logic function. In gate arrays the interconnect pattern is defined by the manufacturer using customized process masks. In FPGAs the interconnect pattern is programmed electrically by the user.

FPGAs generally include an array of programmable function units (PFUs). A PFU may also be called a configurable logic block (CLB) or a configurable logic element (CLE). Each PFU is a small programmable logic block which often includes one or more input lines, one or more output lines, one or more latches, and one or more look-up table (LUTs). There are usually a greater number of input lines than output lines, with each input line being either a dedicated data line or a dedicated control line. The LUT can be programmed to perform various functions including general combinatorial or control logic, read only memory (ROM), random access memory (RAM), or data path functions between the input and output lines. In this manner, the LUT determines whether the respective PFU performs general logic, or a special mode such as an adder, a subtracter, a counter, an accumulator, a register, or a memory cell such as single-port ROM or a single-port RAM. In some instances, the LUT can be used relatively independently of the latches. FPGAs typically contain on the order of 100–1000 essentially identical PFUs.

FPGAs also include a programmable interconnection network that surrounds the PFUs. The interconnection network includes programmable crosspoint switches and metal interconnect segments (routing nodes) for selectively coupling various PFUs. The crosspoint switches are also called programmable interconnect points (PIPs). The crosspoint switches provide signal switching, amplification, and isolation. The metal interconnect segments may be arranged symmetrically about the FPGA's horizontal and vertical axis.

The function of the FPGA is determined by the combined programming of the PFUs and the interconnection network. The user selects the FPGA function by loading a configuration bit stream into the FGPA at power-up or under system control to accomplish this combined programming. Various bits of the configuration bit stream are stored in the FPGA's internal configuration RAM. The configuration RAM is coupled to the LUTs and to the crosspoint switches. Therefore, the configuration bit stream determines the specific function for each PFU as well as the interconnections between the input and output lines of various PFUs, external bonding pads, and other circuitry in the FPGA. The configuration bit stream may initially reside in an electrically erasable programmable ROM (EEPROM), a ROM on a circuit board, or any other storage medium external to the FPGA.

FPGAs may also be defined in terms of programmable logic cells (PLCs) and programmable input-output cells (PICs). The PLCs contain the PFUs, various configuration RAM, and portions of the interconnect network that couple to the PFUs. Thus, various logic functions are performed in the PLCs. The PICs are located at the perimeter of the device, outside the PLCs. The PICs contain input-output buffers, various configuration RAM, and portions of the interconnect network that couple to the bonding pads. Each PIC, for instance, may contain four buffers for interfacing with four bonding pads. Each buffer may be configured as an input, an output, or a bi-directional input-output. Each buffer may also be configured as TTL or CMOS compatible.

FPGAs are further described in U.S. Pat. Nos. 5,386,156; 5,384,497; 4,870,302; U.S. Pat. Re. No. 34,363; and European Patent Specification Publication No. 0 177 261 B 1; which are all incorporated herein by reference.

RAMs include one or more cells (memory units) with each cell storing a single bit of information. Each cell can be accessed for a read or write operation in some fixed amount of time that is independent of the cell's position or address. This distinguishes RAM from serial, or partly serial, access storage devices such as magnetic tapes, drums, and disks. Access times on the latter devices depend upon the address or position of the data. The address, data and control lines associated with RAM collectively constitute one or more ports. Single-port RAMs allow access to memory cells by only one port. Thus, single-port RAMs do not permit simultaneous operations from different addresses. Multi-port RAMs allow access to memory cells by two or more functionally independent ports. Thus, multi-port RAMs permit simultaneous operations from different addresses. Multi-port RAMs include dual-port RAMs, triple-port RAMs, quadruple-port RAMs, and so on. Dual-port RAMs find use, for instance, in buffers, queues, and registers which require constant updating by both read and write operations. Applications for dual-port RAMs include telecommunications channels which receive data from one source (e.g., a line.) and transfer the data to another source (e.g., a computer). In this instance, the line would be connected to a first port, and the computer would be connected to a second port.

PFUs have been devised to implement dual-port RAMs. For example, an N-input LUT may include a $2^N$ bit bank of memory cells, an N-to-$2^N$ bit decoder, and an output. This provides a single-port ROM, with the configuration bit stream loading the memory, and the decoder selecting the appropriate cell in response to an address signal. To provide a single-port RAM, additional logic is included to write data into the LUT. A dual-port RAM may be obtained, as taught in the prior art, by providing a second N-to-$2^N$ bit decoder for the single-port RAM. The second decoder selects a RAM cell in response to a second address signal. The first and second decoders permit simultaneous access to the RAM cells by separate address signals. In a similar manner, a third N-to-$2^N$ bit decoder may provide a triple-port RAM, and so on.

Unfortunately, the additional decoders are usually dedicated solely to multi-port RAM operation. If a given PFU is not used as a multi-port RAM, then the additional decoder has little or no use. Since a primary purpose of FPGAs is the ability to implement a wide variety of functions, the use of decoders dedicated solely to supporting multi-port RAMs tends to be a costly and inefficient approach.

Another approach to implementing dual-port RAMs in FPGAs has been recently reported in "XC4000E Logic Cell Array Family", Product Preview, by Xilinx, Inc., May 2, 1995, pp. 1–4. In a first mode, a 16×2 single-port RAM in a CLB consists of a 16×1 single-port "F-RAM" and a 16×1 single-port "G-RAM". In a second mode, the 16×2 single-port RAM is converted into a 16×1 dual-port RAM. In dual-port mode, any operation that writes to the F-RAM automatically writes to the G-RAM using the F-address. A major drawback, however, is that in dual-port mode the G-address can not be used to write to the G-RAM. As a result, the 16×1 dual-port RAM has a read/write port using the F-address, but has a read-only port using the G-address.

Accordingly, there is a need for an FPGA which efficiently implements multi-port RAMs which support both read and write operations at each port.

SUMMARY OF THE INVENTION

A primary aspect of the present invention is an FPGA which implements multi-port RAMs by way of programmable switching devices for providing bit-level coupling between various RAM cells.

In accordance with one aspect of the invention, an FPGA includes an LUT for implementing a plurality of functions including first and second RAM cells, and a programmable switching device dedicated to coupling and decoupling the RAM cells. The first and second RAM cells are coupled to respective first and second read/write ports. The RAM cells function individually as single-port RAM cells when decoupled by the switching device. However, the RAM cells share data to function collectively as a dual-port RAM cell when coupled by the switching device. The dual-port RAM cell is accessible by both the first and second read/write ports.

BRIEF DESCRIPTION OF THE DRAWING

The invention, together with its various features and advantages, can be readily understood from the following detailed description taken in conjunction with the accompanying drawing, in which.

DETAILED DESCRIPTION

Figure 1:
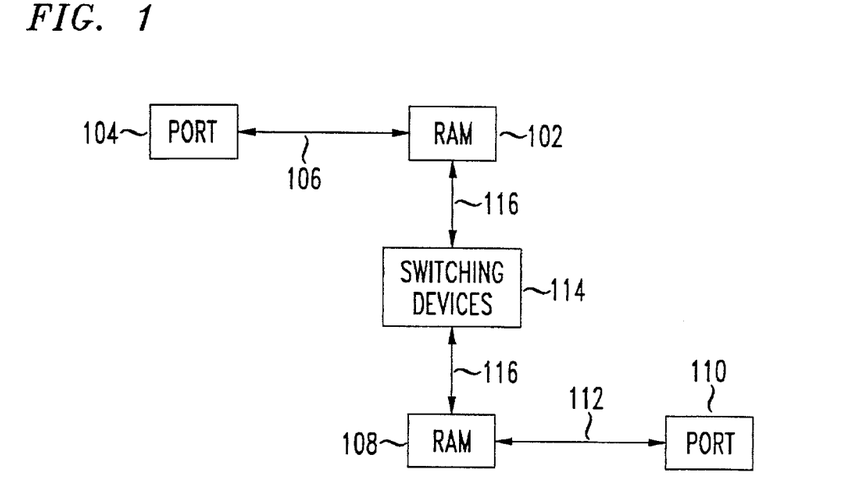
FIG. 1 is a simplified schematic diagram generally illustrating an embodiment of the invention.

Referring to FIG. 1, there is shown a simplified schematic diagram generally illustrating an embodiment of the invention. As is seen, RAM 102 is coupled to port 104 by channel 106, and RAM 108 is coupled to port 110 by channel 112. In addition, switching devices 114 are coupled between RAMs 102 and 108 by channel 116. The RAMs, channels and switching devices are part of an FPGA embodied in an integrated circuit, such as a semiconductor chip. RAMs 102 and 108 are provided by programmable elements, such as one or more LUTs, in response to a configuration bit stream. Ports 104 and 110 are preferably read/write ports, with channels 106 and 112 including, for illustration purposes, address lines, read lines, write lines, and read/write control lines. Switching devices 114 are also responsive to the configuration bit stream. Preferably, switching devices 114 are dedicated solely to converting single-port RAMs into multi-port RAMs, as opposed to generic crosspoint switches in the interconnection network.

When the configuration bit stream instructs switching devices 114 to decouple RAM 102 from RAM 108, then RAMs 102 and 108 function individually as separate, single-port RAMs. That is, with respect to channel 116, RAM 102 is decoupled from port 110, and RAM 108 is decoupled from port 104.

When, on the other hand, the configuration bit stream instructs switching devices 114 to couple RAM 102 to RAM 108, then RAMs 102 and 108 function collectively as a single, multi-port RAM. In this mode, switching devices 114 provide bit-level coupling between RAMs 102 and 108 through channel 116. Each cell in RAM 102 is coupled to a single cell in RAM 108, and each cell in RAM 108 is coupled to a single cell in RAM 102. This forms coupled pairs of memory cells, with each coupled pair including one cell from RAM 102 and one cell from RAM 108. The cells of a coupled pair share data with one another. That is, the logic values stored in each cell of a coupled pair are identical to one another. As a result, RAM 102 is coupled to port 110, and RAM 108 is coupled to port 104. Therefore, both RAM 102 and RAM 108 are accessible through both port 104 and port 110 to support multi-port RAM operation.

Figure 2:
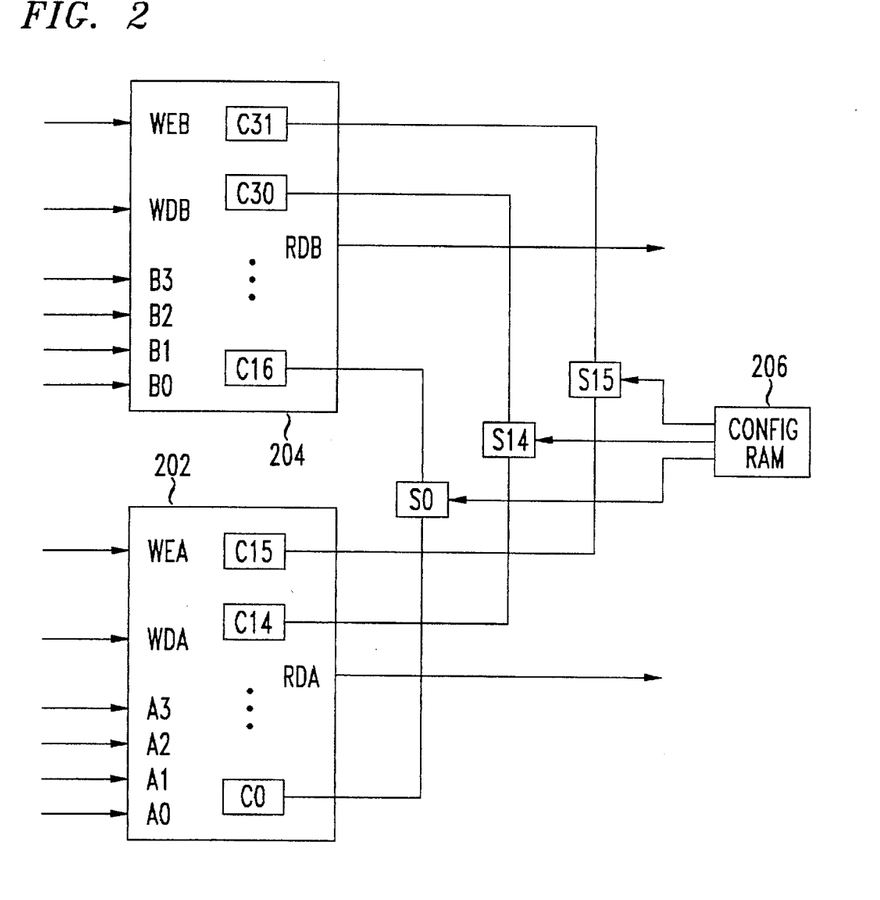
FIG. 2 is a simplified schematic diagram illustrating two 16×1 single-port RAMs converted into a 16×1 dual-port RAM in accordance with another embodiment of the invention.

Referring to FIG. 2, there is shown a simplified schematic diagram illustrating two 16×1 single-port RAMs converted into a 16×1 dual-port RAM in accordance with another embodiment of the invention. LUTs 202 and 204 implement respective 16×1 RAMs in response to a configuration bit stream. It is understood that LUTs 202 and 204 may be portions (e.g., half-LUTs) of a single LUT, or separate LUTs. In any event, LUTs 202 and 204 are interchangeable with a single larger LUT. Similarly, LUTs 202 and 204 are interchangeable with a larger number of smaller LUTs. For example, LUT 202 may be replaced by two LUTs that each implement an 8×1 single-port RAM. Although it is preferred that LUTs 202 and 204 reside in the same PFU, they may also reside in separate PFUs, in which case the separate PFUs are preferably adjacent to one another.

LUT 202 comprises 16 RAM cells C0–C15. For clarity of illustration, only cells C0, C14 and C15 are shown. LUT 202 receives address lines A0–A3 for selecting one of cells C0–C15. LUT 202 also includes a 4×16 decoder (not shown) between address lines A0–A3 and cells C0–C15 to accomplish this selection. LUT 202 receives write data line WDA for providing data to be written into cells C0–C15. LUT 202 also receives write enable line WEA as a read/write control line for selecting between read and write operations for cells C0–C15. LUT 202 couples the contents of cells C0–C15 to read data line RDA. Lines A0–A3, WDA, WEA, and RDA collectively provide a read/write port for cells C0–C15.

LUT 204 is similar to LUT 202. LUT 204 comprises 16 RAM cells C16–C31, with cells C16, C30 and C31 being shown. LUT 204 receives address lines B0–B3 for selecting one of cells C16–C31 through a 4×16 decoder (not shown). LUT 204 also receives write data line WDB and write enable line WEB for cells C16–C31. Likewise, LUT 204 couples the contents of cells C16–C31 to read data line RDB. Lines B0–B3, WEB, WDB and RDB collectively provide a read/write port for cells C16–C31.

Switching devices S0–S15, representing an illustrative arrangement of switching devices 114, are coupled between LUTs 202 and 204. For clarity of illustration, only switching devices S0, S14 and S15 are shown. Each switching device S0–S15 is coupled between one of cells C0–C15 and one of cells C16–C31. For instance, switching device S0 is coupled between cells C0 and C16, switching device S14 is coupled between cells C14 and C30, and switching device S15 is coupled between cells C15 and C31. Switching devices S0–S15 are also commonly connected to FPGA configuration RAM cell 206. Cell 206 determines whether switching devices S0–S15 are commonly set for coupling or for decoupling. If cell 206 stores a first logic value, then switching devices S0–S15 are all set for coupling (i.e., closed), whereas if cell 206 stored a second logic value, then switching devices S0–S15 are all set for decoupling (i.e., opened). The logic value stored in cell 206 is determined by the configuration bit stream. Therefore, switching devices S0–15 are programmable, in response to the configuration bit stream, for coupling for decoupling cells C0–C15 to or from cells C16–C31.

When switching devices S0–S15 are set for decoupling, then LUTs 202 and 204 function individually as separate, single-port 16×1 RAMs. Alternatively, when switching devices S0–S15 are set for coupling, then LUTs 202 and 204 are converted into a single 16×1 dual-port RAM. In dual-port mode, cells C0–C15 are bit-level coupled, in one-to-one relationship, to cells C16–C31. That is, cells C0 and C16 form a first coupled pair, cells C1 and C17 form a second coupled pair, and cells C15 and C31 form a sixteenth coupled pair. Furthermore, cells C0–C15 are accessible by the read/write port comprising lines B0–B3, WDB, WEB, and RDB, and cells C16–C31 are accessible by the read/write port comprising lines A0–A3, WDA, WEA, and RDA.

Figure 3:
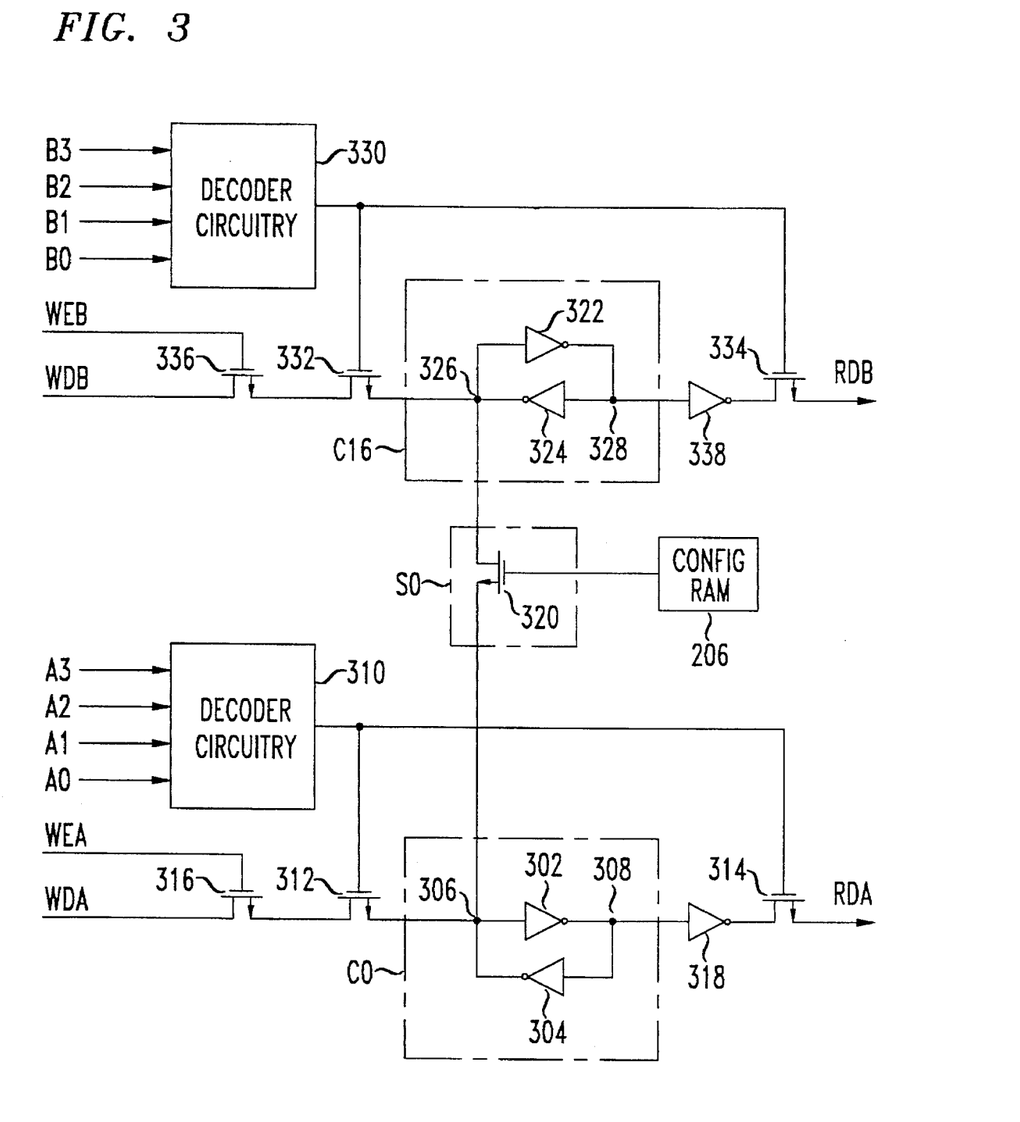
FIG. 3 is a simplified circuit diagram illustrating one embodiment of certain elements in FIG. 2.

Referring to FIG. 3, there is shown a simplified circuit diagram of one embodiment of certain elements of FIG. 2. Cell C0 includes reverse-coupled inverters 302 and 304 coupled together at nodes 306 and 308. The 4×16 decoder associated with LUT 202 is provided by the combination of decoder circuitry 310 and transistors 312 and 314. Decoder circuitry 310 is coupled to address lines A0–A3. If address lines A0–A3 are set to 0000, decoder circuitry 310 turns on transistors 312 and 314. During a write operation, WEA turns on transistor 316, which couples WDA to transistor 312, which in turn couples WDA to node 306 thereby writing the logic value at WDA into cell C0. During a read operation, WEA turns off transistor 316 which decouples WDA from transistor 312. The logic value at node 308, however, is inverted by inverter 318, and the output of inverter 318 is coupled by transistor 314 to RDA. As a result, RDA assumes the logic value stored at node 306.

In a similar manner, cell C16 includes reverse-coupled inverters 322 and 324 coupled together at nodes 326 and 328. The 4×6 decoder associated with LUT 204 includes decoder circuitry 330 and transistors 332 and 334. With address lines B0–B3 set to 0000, decoder circuitry 330 turns on transistors 332 and 334, thereby sending the logic value at node 326 to RDB for read operations, and storing the logic value of WDB at node 326 for write operations if permitted by WEB.

Cells C0 and C16 are coupled to switching device S0, which consists of transistor 320. The source and drain of transistor 320 are coupled to nodes 306 and 326, respectively. The gate of transistor 320 is coupled to configuration RAM cell 206. Thus, cell 206 determines whether or not transistor 320 couples together nodes 306 and 326. If cell 206 stores a logic LOW (or 0), then transistor 320 turns off and does not couple node 306 to node 326. Alternatively, if cell 206 stores a logic HIGH (or 1), then transistor 320 turns on and shorts together nodes 306 and 326. This short-circuit condition provides bit-level coupling between cells C0 and C16.

If transistor 320 turns on while cells C0 and C16 store different logic values, then the shared logic value arrived at between cells C0 and C16 may be indeterminate. Since, however, the configuration bit stream is loaded before cells C0 and C16 perform data processing operations, a conflict between cells C0 and C16 should not occur. Presumably, when LUTs 202 and 204 are programmed by the configuration bit stream to implement cells C0 and C16, respectively, then cells C0 and C16 are reset to a common logic value (such as LOW) before bit-level coupling through transistor 320 occurs.

Transistor 320 is dedicated solely to coupling or decoupling cells C0 and C16 in accordance with instructions from cell 206. Preferably, each of the switching devices S0–S15 consists of a single transistor, similar to transistor 320, with the gates of the single transistors commonly connected to cell 206. Of course, other forms of switching devices may be used, such as pairs of complementary pass transistors. Furthermore, additional inverters may be coupled to cells C0 and C16 as buffers for speed and noise considerations.

Figure 4:
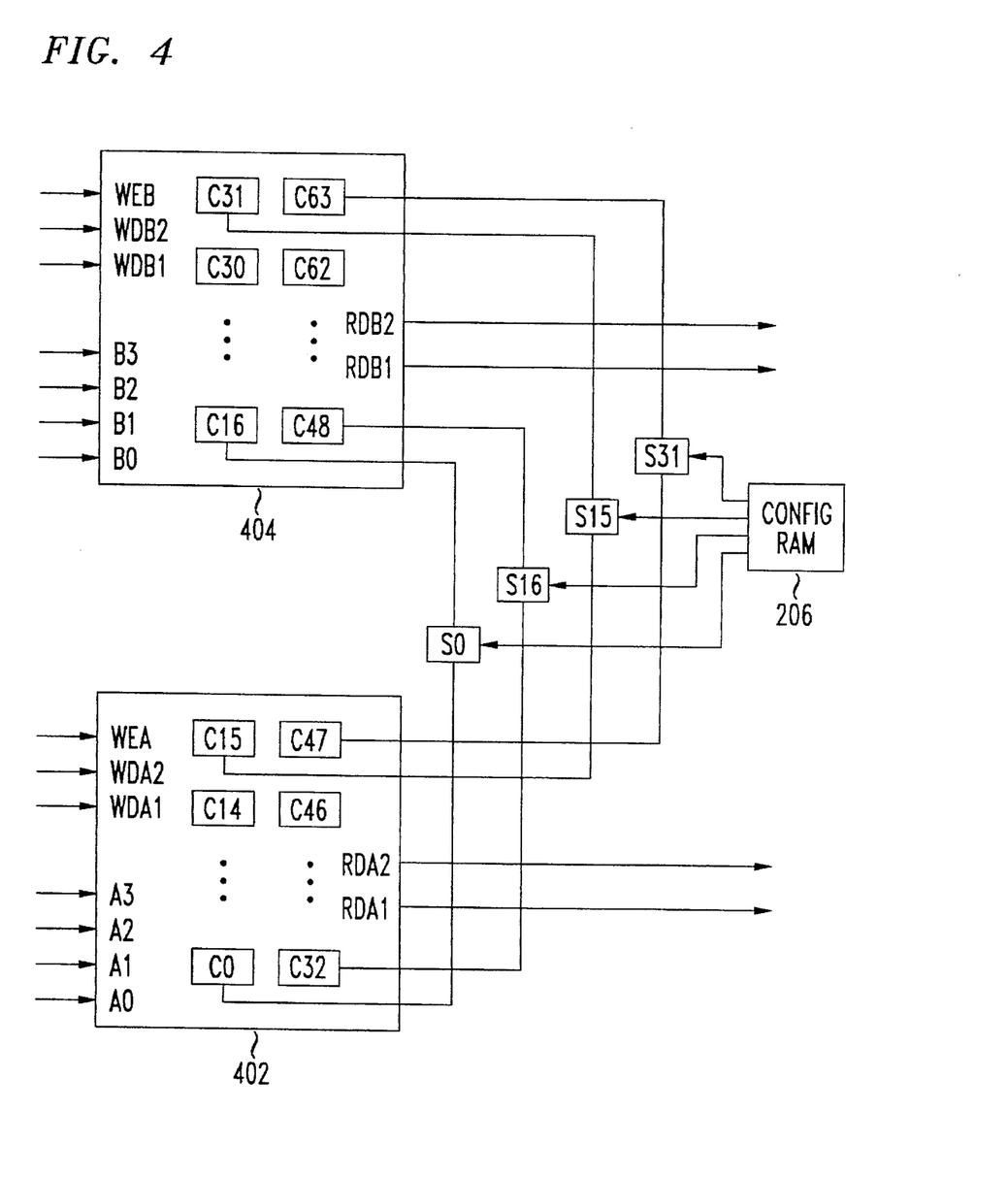
FIG. 4 is a simplified schematic diagram illustrating two 16×2 single-port RAMs converted into a 16×2 dual-port RAM in accordance with another embodiment of the invention.

Referring to FIG. 4, there is shown a simplified schematic diagram illustrating two 16×2 single-port RAMs converted into a 16×2 dual-port RAM in accordance with another embodiment of the invention. Much of the previous discussion pertains to this embodiment and need not be repeated. However, LUT 402 includes a first set (or bank) of RAM cells C0–C15, and a second set (or bank) or RAM cells C32–C47. In addition, WDA is replaced by WDA1 and WDA2, and RDA is replaced by RDA1 and RDA2. WDA1 and RDA1 are coupled to the first set of RAM cells, C0-C15. Likewise, WDA2 and RDA2 are coupled to the second set of RAM cells, C32–C47. LUT 402 includes a 4×16 decoder (not shown). Address lines A0–A3 select two RAM cells, one from cells C0–C15, and the other from cells C32–C47. For instance, address 0000 selects cells C0 and C32, and address 1111 selects cells C15 and C47. If the address is 0000 and WEA is high, the logic value at WDA1 is stored in cell C0, and the logic value at WDA2 is stored in cell C32. If the address is 0000 and WEA is low, the contents of cells C0 and C32 are coupled to RDA1 and RDA2, respectively.

LUT 404 is similar to LUT 402. LUT 404 includes a first set of RAM cells, C16–C31, and a second set of RAM cells C48–C63. In addition, WDB is replaced by WDB1 and WDB2, and RDB is replaced by RDB1 and RDB2. WDB1 and RDB1 are coupled to the first set of RAM cells, C16–C31, and WDB2 and RDB2 are coupled to the second set of RAM cells, C48–C63. Address lines B0–B3 select two RAM cells, one from cells C16–C31, and the other from cells C48–C63.

LUTs 402 and 404 each contain 16×2, or 32 RAM cells. Therefore, switching devices S0–S31 are coupled between LUTs 402 and 404. Switching devices S0, S15, S16 and S31 are shown. Switching device S0 is coupled between cells C0 and C16, switching device S15 is coupled between cells C15 and C31, switching device S16 is coupled between cells C32 and C48, and switching device S31 is coupled between cells C47 and C63. Alternatively, if desired, the switching devices can be coupled between the first set of cells in LUT 402 and the second set of cells in LUT 404, and vice-versa.

Figure 5:
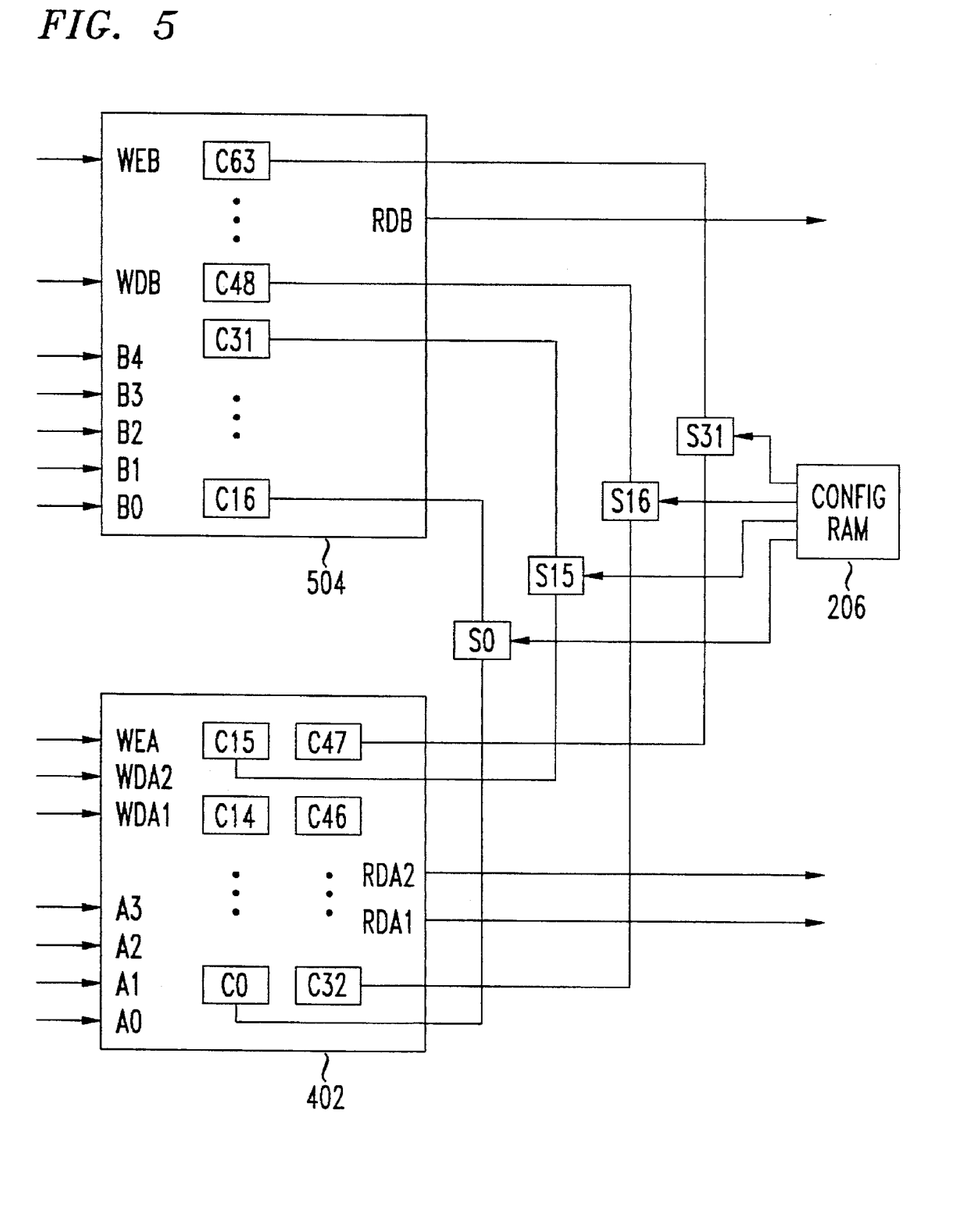
FIG. 5 is a simplified schematic diagram illustrating a 16×2 single-port RAM and a 32×1 single-port RAM converted into a dual-port RAM in accordance with another embodiment of the invention.

FIG. 5 is a simplified schematic diagram illustrating a single-port 16×2 RAM and a single-port 32×1 RAM converted into a dual-port RAM in accordance with another embodiment of the invention. Much of the previous discussion pertains to this embodiment and need not be repeated. For instance, LUT 402 is a 16×2 single-port RAM with cells C0–C15 and C32–C47. However, LUT 504 is a 32×1 single-port RAM with cells C16–C31 and C48–C63. LUT 504 includes an additional address line, line B4. LUT 504 also includes a 5×32 decoder (not shown) for permitting address lines B0–B4 to select any one of cells C16–C31 and C48–C63. Switching devices S0–S31 are coupled between LUTs 402 and 504, with switching devices S0, S15, S16 and S31 being shown. LUTs 402 and 504 provide a "corner turning" dual-port RAM in which two bit streams (associated with cells C0–C15 and C32–C47, respectively) can be transformed into a single bit stream (associated with cells C16–C31 and C48–C63).

Figure 6:
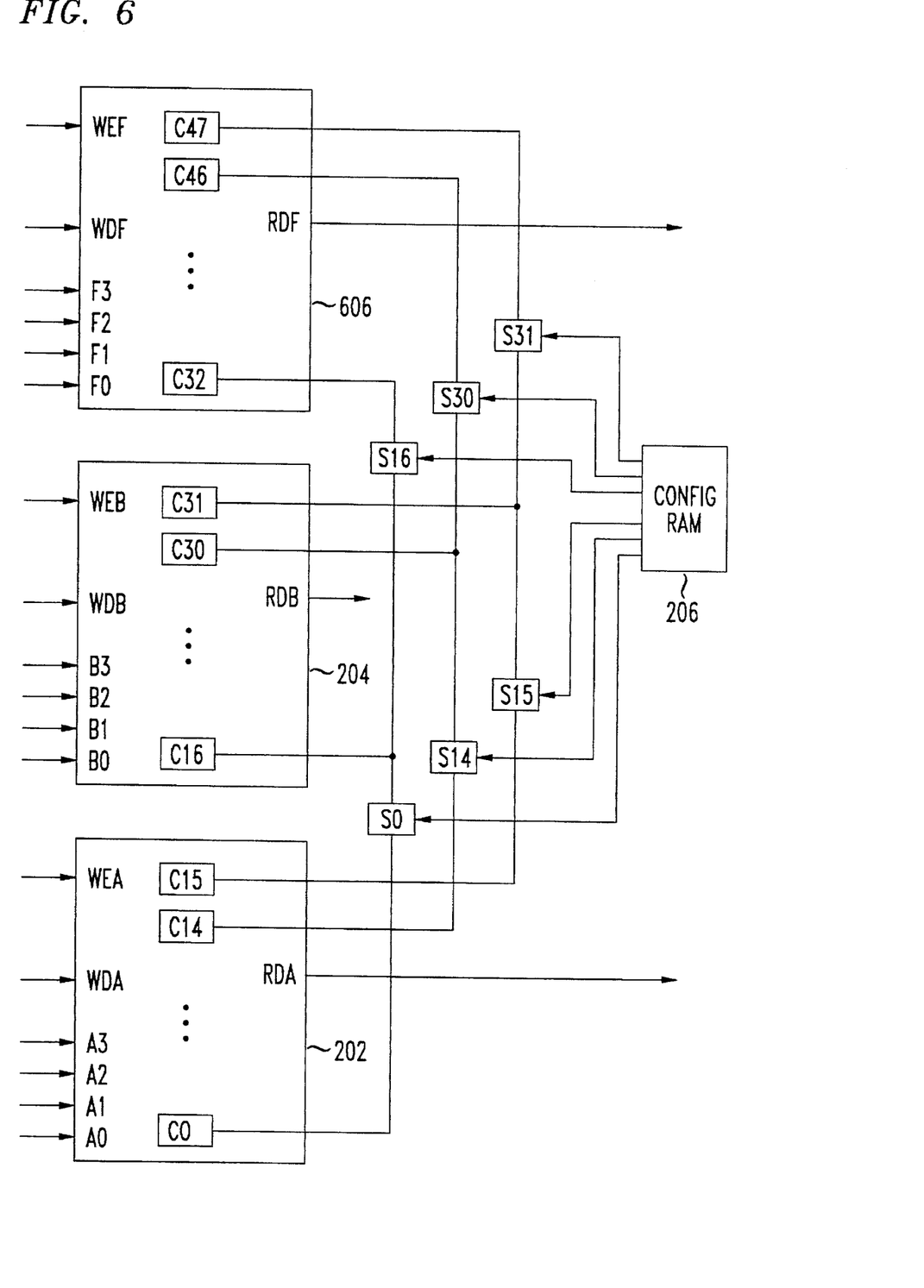
FIG. 6 is a simplified schematic diagram illustrating three 16×1 single-port RAMs converted into a 16×1 triple-port RAM in accordance with another embodiment of the invention.

FIG. 6 is a simplified schematic diagram illustrating three 16×1 single-port RAMs converted into a 16×1 triple-port RAM in accordance with another embodiment of the invention. Much of the previous discussion applies to this embodiment and need not be repeated. For instance, LUTs 202 and 204 are 16×1 single-port RAMs. However, LUT 606 is a third 16×1 single-port RAM. LUT 606 is similar to LUTs 202 and 204. LUT 606 comprises 16 RAM cells C32–C47, with cells C32, C46 and C47 being shown. LUT 606 receives address lines F0–F3 for selecting one of cells C32–C47. LUT 606 is coupled to write data line WDF, write enable line WEF, and read data line RDF. Lines F0–F3, WEF, WDF and RDF collectively provide a read/write port for cells C32–C47.

Switching devices S0–S15 are coupled between LUTs 202 and 204, with switching devices S0, S14 and S15 being shown. Likewise, switching devices S16–S31 are coupled between LUTs 204 and 606, with switching devices S16, S30 and S31 being shown. Pairs of switching devices are coupled to one of cells C0–C15, one of cells C16–31, and one of cells C32–C47. For instance, switching device S0 is coupled between cells C0 and C16, and switching device S16 is coupled between cells C16 and C32. Switching devices S0–S31 are also commonly connected to configuration RAM cell 206. When switching devices S0–S31 are set for decoupling, LUTs 202, 204 and 606 function individually as separate, 16×1 single-port RAMs. Alternatively, when switching devices S0–S31 are set for coupling, LUTs 202, 204 and 606 are converted into a single 16×1 triple-port RAM. In triple-port mode, cells C0–C15 are bit-level coupled, in one-to-one relationship, to cells C16–C31, and to cells C32–C47. That is, cells C0, C16 and C32 form a first coupled triplet through switching devices S0 and S16, and cells C15, C31 and C47 form a sixteenth coupled triplet through switching devices S15 and S31. Furthermore, cells C0–C15, C16–C31, and C32–C47 are all accessible by the three read/write ports associated with LUTs 202, 204 and 606.

With the teachings of the invention, an FPGA can be upgraded to provide multi-port RAMs with relatively little additional hardware. For example, switching devices 114 are likely to occupy far less silicon area than an additional decoder. As a result, the invention provides for a highly efficient implementation of a multi-port RAM in a FPGA.

Other variations of the invention will be apparent to those skilled in the art. For example, the RAM cells implemented by the LUT (or LUTs) may be arranged in arrays of various sizes. Although configuration RAM cell 206 is shown as a separate cell for receiving a particular bit from the configuration bit stream, it is understood that other configuration RAM cells in the FPGA can be decoded to provide the coupling/decoupling instruction to switching devices 114. Other programmable elements besides an LUT may be used to implement RAM. Furthermore, in a given FPGA, some but not all PFUs may include switching devices 114. If first and second configuration bit streams are sequentially applied, a PFU may first implement $2^{N+1}$ single-port RAM cells, and later implement $2^N$ dual-port RAM cells. Likewise, a configuration bit stream may program first and second essentially identical PFUs so that the first PFU implements $2^{N+1}$ single-port RAM cells while the second PFU implements $2^N$ dual-port RAM cells. The portions of the configuration bit stream applied to the first and second PFUs may differ by only the value of a single bit. A method of making a multi-port RAM using an FPGA is apparent from the foregoing.

Having described the preferred embodiments of this invention, it will now be apparent to one of ordinary skill in the art that other embodiments incorporating the concept may be used. Therefore, this invention should not be limited to the disclosed embodiments, but rather should be limited only by the spirit and scope of the appended claims.

The invention claimed is:

1. An integrated circuit including a field programmable gate array (FPGA) which includes a programmable function unit (PFU), comprising:

first and second programmable elements for generating various functions including first and second respective RAM cells in response to a configuration bit stream; and a programmable switching device responsive to the configuration bit stream for providing bit-level coupling between the RAM cells so that the RAM cells together provide a multi-port RAM cell.

2. The integrated circuit of claim 1 in which the first and second programmable elements are included in one or more look-up tables (LUTs).

3. The integrated circuit of claim 1 in which the first and second programmable elements are included in a single PFU.

4. The integrated circuit of claim 1 in which the first and second programmable elements are included in adjacent PFUs.

5. The integrated circuit of claim 1 in which the first and second RAM cells are coupled to respective first and second read/write ports, thereby providing the multi-port RAM cell with at least two read/write ports.

6. An integrated circuit including a field programmable gate array (FPGA), the FPGA including a plurality of programmable function unit (PFUs) and a programmable interconnection network for selectively coupling the PFUs, in which at least one PFU comprises:

a plurality of input lines;

a plurality of output lines; and a look-up table (LUT) for generating a plurality of functions, including first and second RAM cells, in response to a configuration bit stream; and a programmable switching device for coupling and decoupling the RAM cells in response to the configuration bit stream; wherein the RAM cells function individually as separate single-port RAM cells when decoupled by the switching device; and the RAM cells share data to function collectively as a single multi-port RAM cell when coupled by the switching device.

7. The integrated circuit of claim 1 in which the first RAM cell is coupled to a first read/write port, the second RAM cell is coupled to a second read/write port, and the multi-port RAM cell provides both read and write operations through both the first and second read/write ports.

8. An integrated circuit including a field programmable gate array (FPGA), the FPGA including a plurality of programmable function unit (PFUs) and a programmable interconnection network for selectively coupling the PFUs, the PFUs and interconnection network programmable by a configuration bit stream, in which at least one PFU comprises:

a plurality of input lines;

a plurality of output lines;

a plurality of switching devices for coupling and decoupling in response to the configuration bit stream; and a look-up table (LUT) for generating a selected one of a plurality of functions, including first and second functions, between selected input and output lines, in response to the configuration bit stream; such that when either the first or second function is generated, the input lines include address lines, write lines, and read/write control lines, the output lines include read lines, the LUT implements a first decoder and a first set of RAM cells, the LUT implements a second decoder and a second set of RAM cells, the first decoder is coupled to a first set of address lines for selectively coupling a first read line, a first write line, and a first read/write control line to the first set of RAM cells, the second decoder is coupled to a second set of address lines for selectively coupling a second read line, a second write line, and a second read/write control line to the second set of RAM cells, and the switching devices are coupled between the first and second sets of RAM cells;

when the first function is generated, the switching devices decouple the first set of RAM cells from the second set of RAM cells so that each RAM cell provides a single-port RAM cell; and when the second function is generated, the switching devices couple the first set of RAM cells to the second set of RAM cells in one-to-one relationship using bit-level coupling to form coupled pairs of first and second RAM cells, wherein each coupled pair of RAM cells shares data to provide a multi-port RAM cell with multiple read/write ports.

9. The integrated circuit of claim 8 in which the LUT comprises first and second essentially identical LUTs, the first LUT implementing the first decoder and the first set of RAM cells, the second LUT implementing the second decoder and the second set of RAM cells.

10. The integrated circuit of claim 8 in which the PFUs are essentially identical to one another.

11. The integrated circuit of claim 8 in which the multi-port RAM cell is a dual-port RAM cell with two read/write ports.

12. The integrated circuit of claim 8, in which when either the first or second function is generated, the LUT implements a third decoder and a third set of RAM cells, the third decoder is coupled to a third set of the address lines for selectively coupling a third read line, a third write line, and a third read/write control line to the third set of RAM cells, and the switching devices are coupled between the first, second and third sets of RAM cells, when the first function is generated, the switching devices decouple the first, second and third sets of RAM cells from each other so that each RAM cell provides a single-port RAM cell, and when the second function is generated, the switching devices couple the first, second and third sets of RAM cells together in one-to-one relationship using bit-level coupling to form coupled triplets of first, second and third RAM cells, wherein each coupled triplet of RAM cells share data to provide a triple-port RAM cell with three read/write ports.

13. The integrated circuit of claim 8, in which the first set of RAM cells consists of $2^N$ RAM cells, the second set of RAM cells consists of $2^N$ RAM cells, the switching devices consist of $2^N$ switching devices, with each switching device coupled between one RAM cell in the first set of RAM cells and one RAM cell in the second set of RAM cells, when the first function is generated, the LUT implements $2^{N+1}$ single-port RAM cells, and when the second function is generated, the LUT implements $2^N$ dual-port RAM cells.

14. The integrated circuit of claim 13 in which the first decoder is an N-to-$2^N$ bit decoder.

15. The integrated circuit of claim 13, in which the first decoder is an N-to-$2^{N-1}$ bit decoder, the first set of RAM cells consists of first and second banks of $2^{N-1}$ RAM cells, the first read line and the first write line are coupled to the first bank of RAM cells, a third read line and a third write line are coupled to the second bank of RAM cells, and the first read/write control line is coupled to the first and second banks of RAM cells.

16. The integrated circuit of claim 15 in which the second decoder is an N-to-$2^N$ bit decoder.

17. The integrated circuit of claim 13 in which each switching device consists of a single transistor.

18. The integrated circuit of claim 8 in which the switching devices are dedicated solely to converting single-port RAM cells into multi-port RAM cells.

19. The integrated circuit of claim 18 in which the switching devices consist of transistors having drains coupled to the first set of RAM cells, sources coupled to the second set of RAM cells, and gates commonly coupled to configuration RAM in the FPGA.

20. A method of programming a field programmable gate array (FPGA) including a plurality of programmable function units (PFUs) and a programmable interconnection network, the PFUs including a first PFU that includes a plurality of programmable switching devices, comprising the steps of:

applying a first configuration bit stream to the FPGA so that the first PFU provides first and second sets of RAM cells, the first set of RAM cells is coupled to a first read/write port, the second set of RAM cells is coupled to a second read/write port, and the switching devices do not provide bit-level coupling between the RAM cells, thereby decoupling the first set of RAM cells from the second read/write port and decoupling the first set of RAM cells from the first read/write port; and applying a second configuration bit stream to the FPGA so that the first PFU provides the first and second sets of RAM cells, the first set of RAM cells is coupled to the first read/write port, the second set of RAM cells is coupled to the second read/write port, and the switching devices provide bit-level coupling in one-to-one relationship between the first and second sets of RAM cells, such that each RAM cell in the first set of RAM cells is bit-level coupled to a single RAM cell in the second set of RAM cells, and each RAM cell in the second set of RAM cells is bit-level coupled to a single RAM cell in the first set of RAM cells, thereby forming a third set of RAM cells coupled to both the first and second read/write ports.

21. A method of programming a field programmable gate array (FPGA) including essentially identical first and second programmable function units (PFUs) and a programmable interconnection network, the first PFU including a first set of programmable switching devices, the second PFU including a second set of programmable switching devices, comprising the steps of:

applying a configuration bit stream to the FPGA so that the first PFU provides first and second sets of RAM cells, the first set of RAM cells is coupled to a first read/write port, the second set of RAM cells is coupled to a second read/write port, and the first :set of switching devices do not provide bit-level coupling between the first and second sets of RAM cells, thereby decoupling the first set of RAM cells from the second read/write port and decoupling the second set of RAM cells from the first read/write port; and applying the configuration bit stream to the FPGA so that the second PFU provides third and fourth sets of RAM cells, the third set of RAM cells is coupled to a third read/write port, the fourth set of RAM cells is coupled to a fourth read/write port, and the second set of switching devices provide bit-level coupling in one-to-one relationship between the third and fourth sets of RAM cells, such that each RAM cell in the third set of RAM cells is bit-level coupled to a single RAM cell in the fourth set of RAM cells, and each RAM cell in the fourth set of RAM cells is bit-level coupled to a single RAM cell in the third set of RAM cells, thereby forming a fifth set of RAM cells coupled to both the third and fourth read/write ports.

22. A method of programming and operating a field programmable gate array (FPGA) including a plurality of programmable function units (PFUs) and a programmable interconnection network, comprising the steps of:

applying a configuration bit stream to the FPGA for instructing a first PFU to function as a first set of RAM cells coupled to a first mad/write port and as a second set of RAM cells coupled to a second read/write port, and for instructing switching devices in the first PFU to provide bit-level coupling between pairs of the RAM cells so that each RAM cell is a member of one coupled pair, with each coupled pair including one RAM cell from the first set of RAM cells and one RAM cell from the second set of RAM cells, wherein each coupled pair provides a dual-port RAM cell that is accessible by both the first and second read/write ports;

writing data through the first mad/write port into at least one dual-port RAM cell; and reading data through the second read/write port from at least one dual-port RAM cell.

23. The method of claim 22, including reading data through the first mad/write port from at least one dual-port RAM cell, and writing data through the second read/write port into at least one dual-port RAM cell.

24. The method of claim 23, including writing data through the first read/write port into one dual-port RAM cell; and simultaneously reading data through the second read/write port from one dual-port RAM cell.

25. A method making a multi-port RAM cell, comprising the steps of:

providing a field programmable gate array (FPGA) which includes a look-up table (LUT) and a programmable switching device; and applying a configuration bit steam to the FPGA so that the LUT provides first and second RAM cells coupled to respective first and second read/write ports, and the switching device provides bit-level coupling between the RAM cells.

* * * * *